July 14, 1964 W. W. GREUTMAN 3,141,137

BALANCED GAIN CONTROL CIRCUIT

Filed April 20, 1962

INVENTOR.
WELDON W. GREUTMAN

BY Wood, Gust & Irish

ATTORNEYS

United States Patent Office 3,141,137
Patented July 14, 1964

3,141,137

BALANCED GAIN CONTROL CIRCUIT

Weldon W. Greutman, Hicksville, Ohio, assignor to International Telephone and Telegraph Corporation, Nutley, N.J., a corporation of Maryland Filed Apr. 20, 1962, Ser. No. 189,071
7 Claims. (Cl. 330—29)

Figure 1:
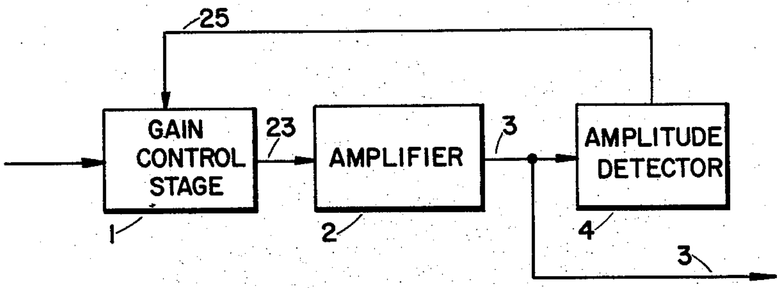

The present invention relates to gain control circuits, and more particularly to an amplifier in which the gain is controlled by a control voltage and the control voltage component is eliminated from the output signal thereof.

Automatic gain control circuits, broadly speaking, are conventional in the respect that an output signal is maintained substantially constant in amplitude even though the amplitude of the input signal may vary. In such circuits, a unidirectional, gain-control voltage as well as the input signal are applied to the control element of an amplifier such that while the gain of the amplifier may be varied to maintain the output signal constant, still a component of the gain control voltage appears in the output signal. In order to reduce distortion to minimum levels, and provide improved operating stability and linearity, it is desirable to eliminate the control voltage component from the output signal. The present invention provides a gain control circuit wherein the control voltage component in the output signal is effectively balanced out or otherwise eliminated.

It is an object of this invention to provide a gain control circuit wherein the gain control voltage component is effectively balanced out or otherwise eliminated from the output signal thereof.

It is another object of this invention to provide a transistor type amplifier having a gain which is controlled by a control voltage and which produces an output signal which is substantially free of any component of the control voltage.

Other objects will become apparent as the description proceeds.

In accordance with the objects of this invention, there is provided a gain control circuit comprising first and second transistors having a common conductive connection between the emitters thereof. A D.C. power supply is coupled to said transistors such that the operating D.C. current therefrom divides between the two transistors according to the respective impedances thereof. In series with the collector circuit of the second of the transistors is a signal or load resistance across which an output signal is produced in response to collector current. A circuit for applying an alternating input signal is coupled across the base and emitter elements of this same transistor such that the D.C. current passing through both transistors is modulated in accordance with the input signal. Another circuit for applying gain control voltage to the base of the first transistor provides means for varying transistor impedance and the division of operating current between the two transistors. Since the operating current through the aforementioned load resistance will vary as the gain control voltage is varied, it is obvious that the signal developed across the load resistance will rise and wall with the operating current change. In order to eliminate this control voltage component as developed across the load resistance, circuit means are connected between the load resistance and the respective collector for maintaining the D.C. current flow through the load resistance constant. Thus, the only signal that will be developed across the load resistance will be that which corresponds to the alternating input signal already described. In other words, any shifting in the output signal which might be due to the change in gain control voltage will be balanced out or otherwise eliminated, leaving only the alternating signal which may be utilized by subsequent amplifiers and the like.

Figure 2:
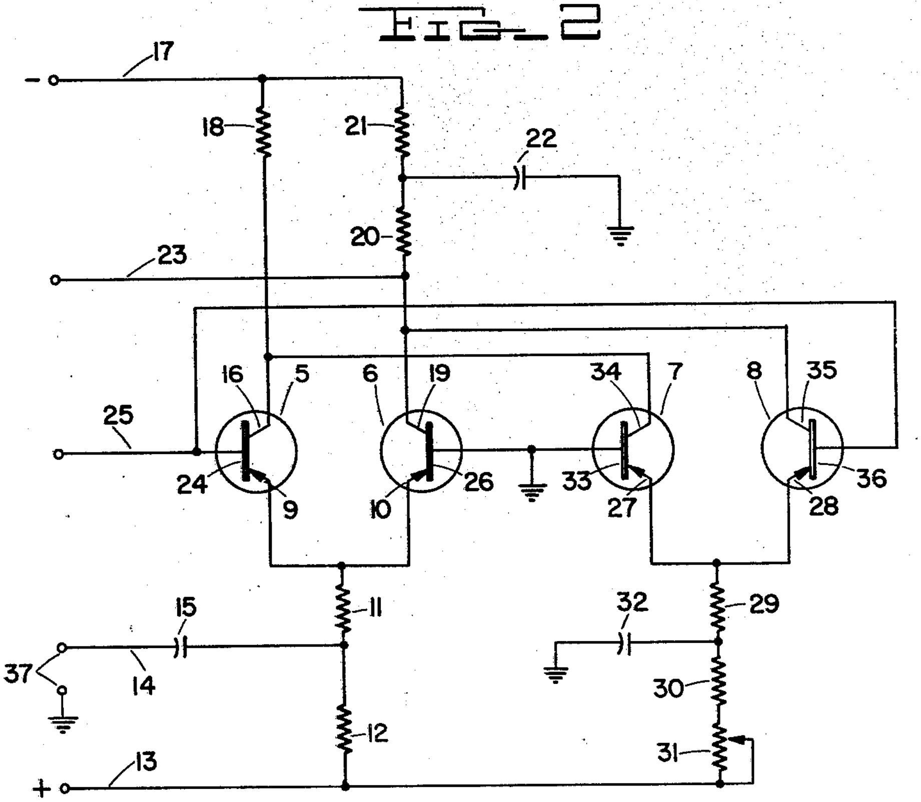

The above-mentioned and other features and objects of this invention and the manner of attaining them will become more apparent and the invention itself will be best understood by reference to the following description of an embodiment of the invention taken in conjunction with the accompanying drawings wherein:

FIG. 1 is a block diagram of a typical automatic gain control circuit which utilizes the circuitry of this invention; and FIG. 2 is a schematic diagram of the gain control circuitry shown in block form in FIG. 1.

Referring to the drawings, and more particularly to FIG. 1, a gain control stage 1 is coupled to a conventional amplifier 2 having an output circuit 3 which in turn is coupled to an amplitude detector 4. The output circuit of the amplitude detector 4 is coupled back to the gain control element of the stage 1 as shown. As illustrated, this block diagram represents conventional circuitry wherein an input signal is applied to the first stage 1 and is amplified by the amplifier 2 and detected or otherwise rectified by the amplitude detector 4 to provide a D.C. control voltage which is fed back to the first stage 1 and applied to the control element thereof in such a direction as to offset any increase or decrease in the input signal which is applied to this first stage 1. By controlling the gain in the first stage, any change in the amplitude of the input signal may be offset so as to provide a constant amplitude signal to the amplifier 2, which may be coupled to utilization circuitry via the output circuit 3.

The gain control stage 1 is represented in detail in FIG. 2, which will now be described. This circuit comprises four transistors 5, 6, 7 and 8 having collector, emitter and base elements, respectively. The emitters 9 and 10 of the transistors 5 and 6 are conductively connected together and to the upper end of a first emitter resistor 11. This resistor 11 is connected in series with another fixed resistance 12 which in turn is connected to the positive line 13 of a D.C. power supply. A signal input circuit 14 which includes a capacitor 15 in series therewith is connected to the junction of the two resistors 11 and 12, one terminal of this input circuit 14 being grounded as shown.

The collector 16 of the transistor 5 is connected to the negative line 17 of the power supply through a resistor 18. Similarly, the collector 19 of the transistor 6 is connected to the supply line 17 through the two series-connected resistors 20 and 21, the junction of these two resistors being grounded through a filter capacitor 22. An output signal circuit 23 is coupled to the junction between the collector 19 and resistor 20 as shown.

A gain control voltage input circuit indicated by the numeral 25 is directly coupled to the base 24 of the transistor 5 as shown, this circuit 25 extending from the amplitude detector 4 as shown in FIG. 1 for providing the gain control voltage which is applied as bias to the transistor 5.

The base 26 of the transistor 6 is grounded as shown or may otherwise be connected to a source of reference bias potential.

The emitters 27 and 28 of transistors 7 and 8, respectively, are connected together and to one end of a resistor 29 as shown. This resistor 29 is also connected in series with two other resistors 30 and 31, the latter resistance being variable and connected to supply line 13. The junction of the two resistors 29 and 30 are grounded through a capacitor 32.

The base 33 of transistor 7 is grounded or otherwise is connected to the base 26 of the transistor 6. The collector 34 of transistor 7 is connected to the collector 16 of transistor 5. Similarly, the collector 35 of transistor 8 is connected to the collector 19 of transistor 6. The base 36 of transistor 8 is connected back to the base 24 of transistor 5.

In a preferred embodiment of the circuit just described, the transistors 5, 6, 7 and 8 are preferably identical. Similarly, the series-resistance 11, 12 is made substantially equal to the series-resistance 29, 30, 31.

Assuming that the positive side of a D.C. power supply is connected to the line 13 and the negative side to the line 17, a D.C. operating current flowing through the resistance 11, 12 will divide through the transistors 5 and 6 as well as the resistances 18 and 20, 21. The division of this current through the transistors 5 and 6 will depend upon the respective impedances thereof, these impedances being controlled by the particular gain control bias which is applied to the base 24. If it is assumed that the bias applied to the bases 24 and 26 of the two transistors 5 and 6 is zero volts, the currents flowing through the two transistors 5 and 6 as well as through the two transistors 7 and 8 will be approximately equal. However, if the voltage on base 24 is increased slightly in the positive direction, less current will flow through transistor 5 but more will flow through transistor 6. Conversely, if the bias on base 24 is reduced, the transistor 5 will conduct more heavily and the transistor 6 less. Inasmuch as the current flowing through resistor 20 also flows through collector 19 of transistor 6, it follows that as the collector 19 current changes, so will the voltage developed over the signal resistor 20.

However, the two transistors 7 and 8 are connected to the two transistors 5 and 6 in such a manner that the D.C. operating current flowing through resistor 20 remains constant even though the current conducted by the transistor 6 may change. This is brought about in the following manner. Current through the resistors 29, 30 and 31 divides between the two transistors 7 and 8 in accordance with the respective impedances thereof, the same as already described in connection with transistors 5 and 6. This division of current between transistors 7 and 8 is altered by varying the bias on the base 36, and since this base 36 is connected to the base 24 of transistor 5, it follows that the impedances of the two transistors 5 and 8 will vary substantially identically. Similarly, since the bases of the two transistors 6 and 7 are connected together, the impedances of these transistors will vary substantially identically.

Now considering a specific operating example, if the D.C. voltage on line 25 is raised slightly, current flowing through the two transistors 5 and 8 will be correspondingly reduced, while the current through the transistors 6 and 7 will be correspondingly increased. In other words, the collector 19 current increases while the collector 35 current decreases by a like amount. Since both of the collectors 19 and 35 are connected to the same load resistor 20, it is thus seen that the current flow through this resistor does not change. By the same token, if the voltage on line 25 should reduce slightly in the negative direction, the collector 19 current will increase while the collector 35 current will decrease by a corresponding amount. The total current through the resistor 20 will therefore remain unchanged.

As will now be apparent, any change in the gain control voltage applied to the line 25 will have little or no affect on the normal D.C. operating current which is flowing through the resistor 20.

Now if it is assumed that in addition to the operating potentials which have already been described, an alternating signal is applied to the terminals 37 of the input circuit 14, current flow through the two transistors 5 and 6 only will be correspondingly modulated such that a corresponding signal will be developed over the resistor 20 and coupled to the output circuit 23. If this input signal should reduce slightly in amplitude, the signal in the output circuit 23 will correspondingly reduce. By means of the circuitry of FIG. 1, a gain control bias is developed by the amplitude detector 4 which increases the gain of the transistor 6 in the direction such as to increase by a corresponding amount the amplitude of the output signal developed across the resistor 20. Thus, as the amplitude of the input signal varies, the gain control bias developed by the circuitry of FIG. 1 also varies in a direction to alter the gain of the transistor 6 in a direction to maintain the amplitude of the output signal in the output circuit 23 constant. It should be noted that the alternating signal coupled to the terminals 37 is in no way applied to the circuitry containing the transistors 7 and 8.

It will now be apparent that while the amplitude of a signal developed in the output circuit 23 may be held constant, still any changes in the gain control voltage applied to the line 25 will not be reflected across the resistor 20 by reason of the balancing effect developed by the circuit containing the two transistors 7 and 8, as already explained.

This may be better understood by considering the operation of the circuitry with the elimination of the transistors 7 and 8. In this event, any change in control bias on the line 25 will result in a corresponding change in the collector 19 current which in turn will develop a corresponding voltage change across the resistor 20. Thus, for every change in bias on the line 25, the corresponding change in voltage will be developed across the resistor 20. An alternating input signal applied to the terminals 37 will be amplified as before and appear in the output circuit 23; however, it will be shifted upwardly or downwardly by an amount corresponding to the change in D.C. operating current flowing through the resistor 20. In other words, the average signal current in the output circuit 23 will vary according to the control bias applied to the line 25.

Recapitulating briefly, the transistors 5 and 6 are gain control components, whereas transistors 7 and 8 are balancing components. Total current flow through resistors 11 and 12 is divided between transistors 5 and 6 in accordance with the conduction of transistor 5. By impressing a signal voltage on the junction of resistors 11 and 12, the total current is modulated in accordance therewith and the modulated current is divided in the same proportion as the D.C. operating current just described. The modulated current flowing to the collector 19 of transistor 6 must also flow through the signal resistor 20 over which an output voltage signal is developed.

The gain control voltage impressed on the base 24 of transistor 5 controls the proportional signal amplitude across signal resistor 20, thereby accomplishing control of gain of the applied input signal.

As the gain is varied by varying the collector 19 current, the average output signal current will shift accordingly unless some means of balancing or compensation is provided. The balancing is accomplished by means of the symmetrical circuit including transistors 7 and 8. By causing collector 35 current through signal resistor 20 to increase at the same rate that collector 19 current decreases (or vice versa) a constant operating current is caused to flow through resistor 20. It should be noted that collector 35 current is not modulated by the signal applied to the terminals 37, the only modulation of this current being effected by that voltage which is applied to the line 25.

The variable resistor 31 is provided to compensate for any unbalance in transistor characteristics.

In the following are listed values of the component parts in a typical working embodiment of this invention; however, it will be understood that this invention is not limited to these particular values and that they may be varied in order to obtain desired operating characteristics:

| | | |
|---|---|---|
| Resistor **11** | ohms | 10,000 |
| Resistor **12** | do | 33,000 |
| Capacitor **15** | mf | 1 |
| Resistor **18** | ohms | 22,000 |
| Resistor **20** | do | 15,000 |
| Resistor **21** | do | 5,600 |
| Capacitor **22** | mf | 100 |
| Resistor **29** | ohms | 10,000 |
| Resistor **30** | do | 22,000 |
| Resistor **31** | do | 20,000 |
| Capacitor **32** | mf | 1 |

While I have described above the principles of my invention in connection with specific apparatus, it is to be clearly understood that this description is made only by way of example and not as a limitation to the scope of my invention.

What is claimed is:

1. A gain control circuit comprising first and second amplifying devices each having current-emitting, current-collecting and control elements, a load impedance coupled in series with the current-collecting element of said second amplifying device, first means conductively connecting both said current-emitting elements together, second means for applying a unidirectional operating potential across said first means and both said current-collecting elements, said load impedance being coupled in series with said second means and said second current-collecting element, third means for applying in alternating signal to the control element of said second device, a signal output circuit coupled to said load impedance and providing a signal in response to current changes through said load impedance, third and fourth amplifying devices each having current-emitting, current-collecting and control elements, fourth means conductively connecting the third and fourth current-emitting elements together, said first and fourth means being conductively connected together, the first and third-current-collecting elements being connected together, the second and fourth current-collecting elements being connected together, the second and third control elements being connected together, means for applying a reference bias potential to said second and third control elements, the first and fourth control elements being connected together, and a control voltage input circuit coupled to said first and fourth control elements for applying a control bias thereto.

2. A gain control circuit comprising first and second transistors having emitter, base and collector elements, respectively, a first conductive connection between said emitter elements, a load impedance coupled in series with said second transistor collector element, means for applying a unidirectional operating potential across said conductive connection and said collector elements, said load impedance being coupled in series with said means and said second collector element, means for applying an alternating signal across the emitter and base elements of said second transistor, third and fourth transistors having emitter, base and collector elements, respectively, a second conductive connection between said third and fourth emitter elements, the first and third collector elements being connected together, the second and fourth collector elements being connected together, the second and third base elements being connected together, means for applying a fixed reference bias to said second and third base elements, said first and fourth base elements being connected together, means conductively coupling said first conductive connection to said second conductive connection, and a control voltage input circuit coupled to said first and fourth base elements for applying a control bias thereto.

3. A gain control circuit comprising first and second transistors having emitter, base and collector elements, respectively, a first conductive connection between said emitter elements, a load impedance coupled in series with said second transistor collector element, means for applying a unidirectional operating potential across said conductive connection and said collector elements, said load impedance being coupled in series with said means and said second collector element, means for applying an alternating signal across the emitter and base elements of said second transistor, third and fourth transistors having emitter, base and collector elements, respectively, a second conductive connection between said third and fourth emitter elements, the first and third collector elements being connected together, the second and fourth collector elements being connected together, the second and third base elements being connected together and to a source of reference potential, said first and fourth base elements being connected together, means conductively coupling said first conductive connection to said second conductive connection, and a control voltage input circuit coupled to said first and fourth base elements for applying a control bias thereto.

4. A gain control circuit comprising first and second transistors having emitter, base and collector elements, respectively, a first conductive connection between said emitter elements, a first emitter impedance connected at one end to said conductive connection, means coupled across said second transistor emitter and base elements for modulating current flow through said first emitter impedance, a load impedance connected in series with said second transistor collector element, a signal output circuit coupled to said second transistor collector and providing a signal responsive to current flow through said load impedance, third and fourth transistors having emitter, base and collector elements, respectively, said third and fourth emitter elements being connected together, a second emitter impedance connected at one end to said third and fourth emitter elements, supply voltage means coupled to the first and second collector elements and to the other ends of said first and second emitter impedances, said load impedance being connected in series with said supply voltage means, the first and third collector elements being connected together, the second and fourth collector elements being connected together, the second and third base elements being connected together and to a source of reference potential, said first and fourth base elements being connected together, and a control voltage input circuit coupled to said first and fourth base elements for applying a control bias thereto.

5. A gain control circuit comprising first and second transistors having emitter, base and collector elements, respectively, a first conductive connection between said emitter elements, a first emitter resistance connected at one end to said conductive connection, a load resistance connected in series with said second transistor collector element, a signal output circuit coupled to said load resistance, a load impedance series connected with said first transistor collector element, a signal input circuit coupled to said emitter resistance, third and fourth transistors having emitter, base and collector elements, respectively, said third and fourth emitter elements being connected together, a second emitter resistance connected at one end to said third and fourth emitter elements, the other end of said second emitter resistance being connected to the other end of said first emitter resistance, the first and third collector elements being connected together, the second and fourth collector elements being connected together, the second and third base elements being connected together and to a source of reference potential, said first and fourth base elements being connected together, and a control voltage input circuit coupled to said first and fourth base elements for applying a control bias thereto.

6. A gain control circuit comprising first and second transistors having emitter, base and collector elements, respectively, a first conductive connection between said emitter elements, a first emitter resistance connected at one end to said conductive connection, a load resistance connected in series with said second transistor collector element, a signal output circuit coupled to said load resistance, a load impedance series connected with said first transistor collector element, a source of supply voltage having one terminal coupled to the other end of said emitter resistance and another terminal coupled to said load resistance and load impedance, a signal input circuit coupled to said emitter resistance, third and fourth transistors having emitter, base and collector elements, respectively, said third and fourth emitter elements being connected together, a second emitter resistance connected at one end to said third and fourth emitter elements, the other end of said second emitter resistance being connected to said one supply terminal, the first and third collector elements being connected together, the second and fourth collector elements being connected together, the second and third base elements being connected together and to a source of reference potential, said first and fourth base elements being connected together, and a control voltage input circuit coupled to said first and fourth base elements for applying a control bias thereto.

7. The gain control circuit of claim 6 wherein all of said transistors have substantially the same operating characteristics and said first and second emitter resistances are equal.

References Cited in the file of this patent

UNITED STATES PATENTS 2,610,260 Moffett ---------------- Sept. 9, 1952